United States Patent
Huang et al.

(10) Patent No.: US 6,248,673 B1
(45) Date of Patent: Jun. 19, 2001

(54) HYDROGEN THERMAL ANNEALING METHOD FOR STABILIZING MICROELECTRONIC DEVICES

(75) Inventors: Ji-Chung Huang; Jang-Cheng Hsieh, both of Hsin-Chu; Chung-Cheng Wu, I-Lan; Kuo-Ching Huang, Kaohsiung, all of (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 09/511,334

(22) Filed: Feb. 23, 2000

(51) Int. Cl.[7] .................................................. H01L 21/469
(52) U.S. Cl. .................... 438/787; 438/778; 438/783; 438/795; 438/958
(58) Field of Search ..................................... 438/778, 781, 438/787, 795, 958, 783

(56) References Cited

U.S. PATENT DOCUMENTS

| | | |
|---|---|---|
| 4,151,007 | 4/1979 | Levinstein et al. . |
| 4,154,873 | 5/1979 | Hickox et al. . |
| 5,334,556 | 8/1994 | Guldi . |
| 5,444,012 * | 8/1995 | Yoshizumi et al. ........... 148/DIG. 55 |
| 5,468,684 * | 11/1995 | Yoshimori et al. ................... 438/240 |
| 5,508,540 * | 4/1996 | Ikeda et al. .......................... 257/298 |
| 5,646,057 | 7/1997 | Liu et al. . |
| 5,660,895 * | 8/1997 | Lee et al. .............................. 427/579 |
| 5,895,274 | 4/1999 | Lane et al. . |

* cited by examiner

Primary Examiner—Trung Dang
(74) Attorney, Agent, or Firm—Tung & Associates

(57) ABSTRACT

Within a method for fabricating a microelectronic fabrication there is first provided a substrate. There is then formed over the substrate a microelectronic device. There is then formed over the microelectronic device a passivating dielectric layer formed from a passivating dielectric material selected from the group consisting of fluorosilicate glass (FSG) passivating dielectric materials, atmospheric pressure chemical vapor deposited (APCVD) passivating dielectric materials, subatmospheric pressure chemical vapor deposited (SACVD) passivating dielectric materials and spin-on-glass (SOG) passivating dielectric materials to form from the microelectronic device a passivated microelectronic device. Finally, there is then annealed thermally, while employing a thermal annealing method employing an atmosphere comprising hydrogen, the passivated microelectronic device to form a stabilized passivated microelectronic device. The method is a "pure $H_2$ (100%)" alloy recipe to use after contact opening or metal-1 formation.

19 Claims, 3 Drawing Sheets

HYDROGEN THERMAL ANNEALING METHOD FOR STABILIZING MICROELECTRONIC DEVICES

BACKGROUND OF THE INVENTION

1. Field of the Invention

The present invention relates generally to methods for fabricating microelectronic fabrications. More particularly, the present invention relates to methods for fabricating, with enhanced stability, microelectronic devices within microelectronic fabrications.

2. Description of the Related Art

Microelectronic fabrications are fabricated employing microelectronic devices as active and passive elements which are connected and interconnected while employing patterned microelectronic conductor layers to form electrical circuits formed within, upon and/or over microelectronic substrates.

As microelectronic fabrication integration levels have increased and microelectronic device and patterned microelectronic conductor layer dimensions have decreased, it has become common in the art of microelectronic fabrication to employ interposed between and passivating microelectronic devices and patterned microelectronic conductor layers within microelectronic fabrications dielectric materials with enhanced gap filling properties and with lower dielectric constant properties. Dielectric materials with enhanced gap filling properties are desirable interposed between and passivating microelectronic devices and patterned microelectronic conductor layers within microelectronic fabrications since there may then be avoided interposed between and passivating microelectronic devices and patterned microelectronic conductor layers dielectric layers having formed therein voids. Similarly, dielectric materials with lower dielectric constant properties (i.e., dielectric constants less than about 3.7 and more preferably from about 3.6 to about 3.8, in comparison with conventional dielectric materials, such as silicon oxide dielectric materials, silicon nitride dielectric materials and silicon oxynitride dielectric materials having dielectric constants of generally greater than about 4.3 and more typically from about 4.0 to about 4.5) are desirable interposed between and passivating microelectronic devices and patterned microelectronic conductor layers within microelectronic fabrications since there is then typically fabricated microelectronic fabrications with enhanced microelectronic fabrication speed, attenuated patterned microelectronic conductor layer cross-talk and attenuated patterned microelectronic conductor layer parasitic capacitance.

While dielectric materials with enhanced gap filling properties and lower dielectric constant properties are thus desirable in the art of microelectronic fabrication, dielectric materials with enhanced gap filling properties and/or lower dielectric constant properties are nonetheless not entirely without problems in the art of microelectronic fabrication. In that regard, it is often observed when fabricating microelectronic fabrications having formed therein semiconductor microelectronic devices, such as but not limited to metal oxide semiconductor field effect transistor (MOSFET) devices, that there is observed instability in various semiconductor microelectronic device performance parameters as a function of the nature of a dielectric material with enhanced gap filling properties and/or lower dielectric constant properties which is employed to either directly or indirectly passivate the semiconductor microelectronic devices.

It is thus towards the goal of forming within the art of microelectronic fabrication microelectronic fabrications having formed therein microelectronic devices either directly or indirectly passivated with various dielectric materials, with enhanced stability of the microelectronic devices, that the present invention is directed.

Various methods have been disclosed in the art of microelectronic fabrication for forming stabilized microelectronic devices and stabilized microelectronic structures within microelectronic fabrications.

For example, Levinstein et al., in U.S. Pat. No. 4,151,007, disclose a method for stabilizing the threshold voltage and the flat band voltage of a metal oxide semiconductor field effect transistor (MOSFET) device employed within a semiconductor integrated circuit microelectronic fabrication. The method employs, after the last thermal process to which the metal oxide semiconductor field effect transistor (MOSFET) device is exposed at greater than about 600 degrees centigrade a thermal annealing of the metal oxide semiconductor field effect transistor (MOSFET) device at a temperature of from about 650 to about 950 degrees centigrade in a pure hydrogen environment.

In addition, Hickox et al., in U.S. Pat. No. 4,154,873, disclose a method for increasing a field inversion voltage of a field oxide layer with respect to a silicon semiconductor substrate employed within a semiconductor integrated circuit microelectronic fabrication, while simultaneously decreasing a leakage current of the field oxide layer with respect to the silicon semiconductor substrate employed within the semiconductor integrated circuit microelectronic fabrication. The method employs, when forming the field oxide layer within the semiconductor integrated circuit microelectronic fabrication: (1) a thermal annealing reoxidation of a field oxide layer while employing an oxidizing gas at a temperature of from about 600 to about 950 degrees centigrade to thus form a reoxidized field oxide layer having an increased density of charge trapped within the bulk of the reoxidized field oxide layer, followed by; (2) a thermal annealing of the reoxidized field oxide layer within a hydrogen annealing environment at a temperature of from about 300 to about 500 degrees centigrade to form a hydrogen annealed reoxidized field oxide layer having a reduced surface charge density in comparison with the reoxidized field oxide layer, while not substantially decreasing the bulk density of charge trapped within the hydrogen annealed reoxidized field oxide layer.

Further, Guldi, in U.S. Pat. No. 5,334,556, discloses a method for forming within a metal oxide semiconductor (MOS) device, such as a metal oxide semiconductor field effect transistor (MOSFET) device, an oxide layer with enhanced dielectric integrity and stability. The method employs incorporating into an otherwise inert gas annealing environment employed for annealing a semiconductor portion of the metal oxide semiconductor (MOS) device, such as a pair of source/drain regions within a semiconductor substrate employed within the metal oxide semiconductor field effect transistor (MOSFET) device, a minor component of an oxidizing gas, such as but not limited to oxygen, hydrogen chloride, nitrogen trifluoride or fluorine, at a point in the thermal annealing method other than the highest temperature plateau employed within the thermal annealing method.

Still further Liu et al., in U.S. Pat. No. 5,646,057, disclose a method for improving the performance characteristics of a metal oxide semiconductor (MOS) device formed within a microelectronic fabrication subsequent to annealing the microelectronic fabrication while employing a rapid thermal annealing method which generally deteriorates the performance of the metal oxide semiconductor (MOS) device formed within the microelectronic fabrication. The method employs subsequent to the rapid thermal annealing of the microelectronic fabrication a conventional thermal annealing of the microelectronic fabrication in a hydrogen annealing environment at a temperature of at least about 430 degrees centigrade.

Finally, Lane et al., in U.S. Pat. No. 5,895,274, disclose a hydrogen thermal annealing method for repairing integrated circuit fabrication induced damage to integrated circuit microelectronic fabrication devices within integrated circuit microelectronic fabrications, where the hydrogen thermal annealing method minimizing a thermal exposure time and a thermal exposure temperature employed within the hydrogen thermal annealing method. The hydrogen thermal annealing method realizes the foregoing objects by employing within the hydrogen thermal annealing method a superambient pressure to compensate for the minimized thermal exposure time and the minimized thermal exposure temperature.

Desirable in the art of microelectronic fabrication are additional methods and materials which may be employed for fabricating within microelectronic fabrications microelectronic devices with enhanced stability.

It is towards the foregoing object that the present invention is directed.

SUMMARY OF THE INVENTION

A first object of the present invention is to provide a method for forming within a microelectronic fabrication a microelectronic device with enhanced stability.

A second object of the present invention is to provide a method in accord with the first object of the present invention, which method is readily commercially implemented.

In accord with the objects of the present invention, there is provided by the present invention a method for forming a microelectronic fabrication. To practice the method of the present invention, there is first provided a substrate. There is then formed over the substrate a microelectronic device. There is then formed over the microelectronic device a passivating dielectric layer formed from a passivating dielectric material selected from the group consisting of fluorosilicate glass (FSG) passivating dielectric materials, atmospheric pressure chemical vapor deposited (APCVD) passivating dielectric materials, subatmospheric pressure chemical vapor deposited (SACVD) passivating dielectric materials and spin-on-glass (SOG) passivating dielectric materials to form from the microelectronic device a passivated microelectronic device. Finally, there is then annealed thermally within an atmosphere comprising hydrogen the passivated microelectronic device to form a stabilized passivated microelectronic device.

There is provided by the present invention a method for forming within a microelectronic fabrication a microelectronic device with enhanced stability. The present invention realizes the foregoing object by passivating the microelectronic device with a dielectric layer formed from a dielectric material selected from the group consisting of fluorosilicate glass (FSG) dielectric materials, atmospheric pressure chemical vapor deposited (APCVD) dielectric materials, subatmospheric pressure chemical vapor deposited (SACVD) dielectric materials and spin-on-glass (SOG) dielectric materials to form a passivated microelectronic device, and then annealing the passivated microelectronic device within an atmosphere comprising hydrogen to form a stabilized passivated microelectronic device.

The method of the present invention is readily commercially implemented. The present invention employs methods and materials as are generally known in the art of microelectronic fabrication, although not disclosed within the context of the specific construction of the present invention. Since it is a process control and materials selection which at least in part provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a microelectronic device with enhanced stability. The present invention realizes the foregoing object by passivating the microelectronic device with a dielectric layer formed from a dielectric material selected from the group consisting of fluorosilicate glass (FSG) dielectric materials, atmospheric pressure chemical vapor deposited (APCVD) dielectric materials, subatmospheric pressure chemical vapor deposited (SACVD) dielectric materials and spin-on-glass (SOG) dielectric materials to form a passivated microelectronic device, and then annealing the passivated microelectronic device within an atmosphere comprising hydrogen to form a stabilized passivated microelectronic device.

Although the preferred embodiment of the present invention illustrates the present invention within the context of forming with enhanced stability a metal oxide semiconductor field effect transistor (MOSFET) device within a semiconductor integrated circuit microelectronic fabrication, the present invention may be employed for forming with enhanced stability metal oxide semiconductor devices such as but not limited to metal oxide semiconductor field effect transistor (MOSFET) devices and metal oxide semiconductor (MOS) capacitor devices, as well as other microeletronic devices including but not limited to transistors, resistors, diodes and capacitors, within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
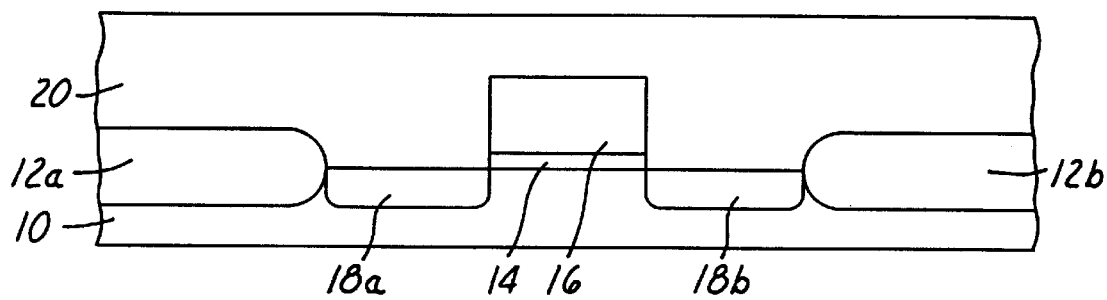
FIG. 1, FIG. 2 and FIG. 3 show a series of schematic cross-sectional diagrams illustrating the results of forming, in accord a preferred embodiment of the present invention, a semiconductor integrated circuit microelectronic fabrication having formed therein a stabilized passivated metal oxide semiconductor field effect transistor (MOSFET) device in accord with the present invention.
Figure 2:
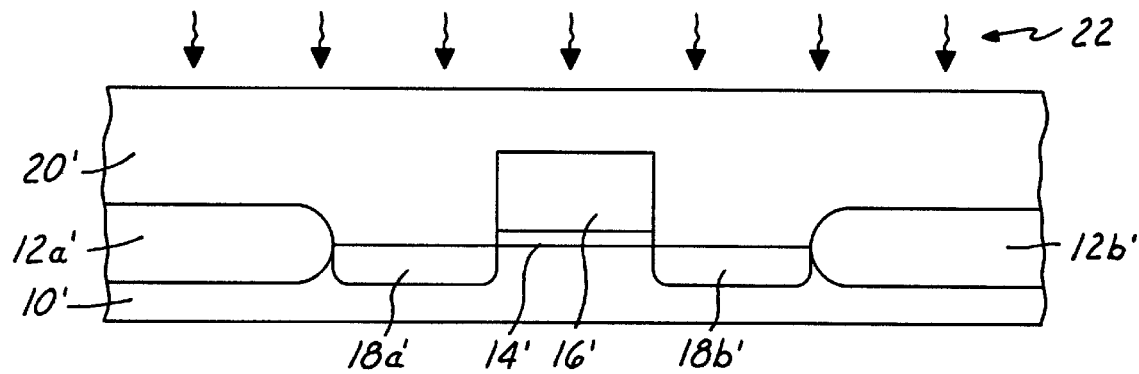
Figure 3:
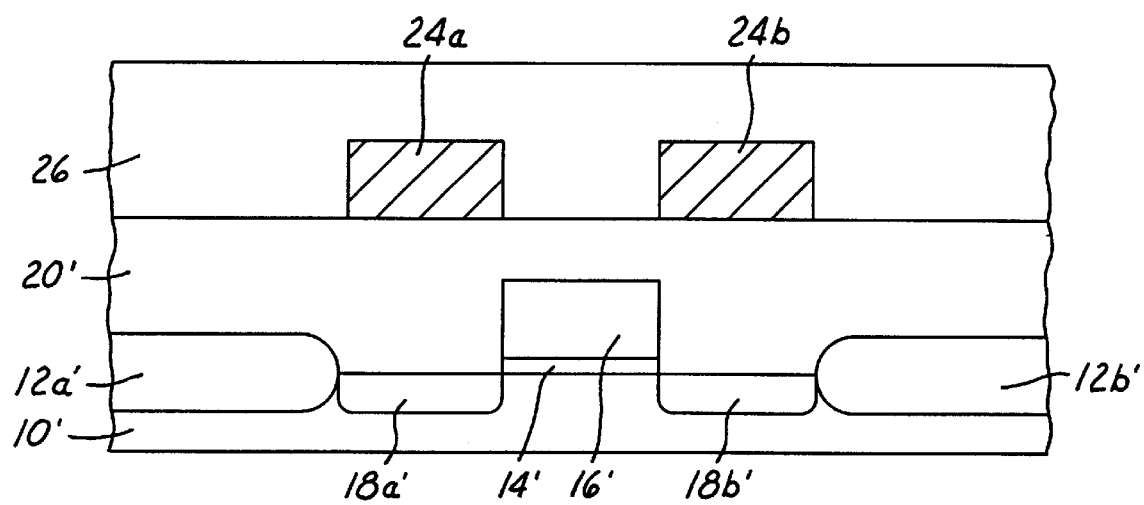

Referring now to FIG. 1 to FIG. 3, there is shown a series of schematic cross-sectional diagrams illustrating the results of forming, in accord with a preferred embodiment of the present invention, a semiconductor integrated circuit microelectronic fabrication having formed therein a stabilized passivated metal oxide semiconductor field effect transistor (MOSFET) device in accord with the present invention.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a pair of isolation regions 12a and 12b which defines an active region of the semiconductor substrate 10. Similarly, there is also shown within FIG. 1 formed within the active region of the semiconductor substrate 10 a series of structures which in an aggregate forms a metal oxide semiconductor field effect transistors (MOSFET) device. The series of structures includes: (1) a gate dielectric layer 14 formed upon the active region of the semiconductor substrate 10; (2) a gate electrode 16 formed aligned upon the gate dielectric layer 14; and (3) a pair of source/drain regions 18a and 18b formed within the active region of the semiconductor substrate 10 at areas not covered by the gate dielectric layer 14 and the gate electrode 16. Within the preferred embodiment of the present invention with respect to the semiconductor substrate 10 and the pair of isolation regions 12a and 12b, as well as the series of structures which comprises the metal oxide semiconductor field effect transistor (MOSFET) device, each of the semiconductor substrate 10, the pair of isolation regions 12a and 12b and the series of structures which comprises the metal oxide semiconductor field effect transistor (MOSFET) device may be formed employing methods and materials as are otherwise conventional in the art of microelectronic fabrication, and in particular in the art of semiconductor integrated circuit microelectronic fabrication.

For example, although it is known in the art of semiconductor integrated circuit microelectronic fabrication that semiconductor substrates may be formed with either dopant polarity, various dopant concentrations and several crystallographic orientations, for the preferred embodiment of the present invention, the semiconductor substrate 10 is typically and preferably a (100) silicon semiconductor substrate having either an N-doping or a P-doping.

Similarly, although it is also known in the art of semiconductor integrated circuit microelectronic fabrication that isolation regions may be formed within and/or upon a semiconductor substrate to define an active region of the semiconductor substrate while employing methods including but not limited to isolation region thermal growth methods and isolation region deposition/patterning methods, for the preferred embodiment of the present invention, the isolation regions 12a and 12b are typically and preferably formed within and upon the semiconductor substrate 10 to define the active region of the semiconductor substrate 10 while employing an isolation region thermal growth method at a temperature of from about 900 to about 1100 degrees centigrade to form the isolation regions 12a and 12b of silicon oxide formed within and upon the semiconductor substrate 10.

Still similarly, within the preferred embodiment of the present invention with respect to the gate dielectric layer 14, although it is also known in the art of semiconductor integrated circuit microelectronic fabrication that gate dielectric layers may analogously with isolation regions be formed employing gate dielectric layer thermal growth methods and gate dielectric layer deposition/patterning methods, for the preferred embodiment of the present invention the gate dielectric layer 14 is typically and preferably formed employing a gate dielectric layer thermal growth method at a temperature of from about 750 to about 1000 degrees centigrade to form the gate dielectric layer 14 of silicon oxide of thickness from about 26 to about 75 angstroms formed upon the active region of the semiconductor substrate 10.

Still yet similarly, within the preferred embodiment of the present invention with respect to the gate electrode 16, although it is known in the art of semiconductor integrated circuit microelectronic fabrication that gate electrodes may be formed of conductor materials including but not limited to metal, metal alloy, doped polysilicon (having a dopant concentration of greater than about 1E19 dopant atoms per cubic centimeter) and polycide (doped polysilicon/metal silicide stack) conductor materials, for the preferred embodiment of the present invention, the gate electrode 16 is typically and preferably formed of a doped polysilicon or polycide conductor material formed to a thickness of from about 1500 to about 2500 angstroms aligned upon the gate dielectric layer 14.

Finally, within the preferred embodiment of the present invention with respect to the pair of source/drain regions 18a and 18b, the pair of source/drain regions 18a and 18b is typically and preferably formed employing an ion implantation method as is conventional in the art of semiconductor integrated circuit microelectronic fabrication. Typically and preferably, the ion implantation method employs a dopant ion of suitable polarity with respect to the semiconductor substrate 10, the dopant ion being implanted at an ion implantation energy of from about 5 to about 100 keV and an ion implantation dose of from about 1E13 to about 1E16 dopant ions per square centimeter.

Finally, there is also shown within the schematic cross-sectional diagram of FIG. 1 an interlevel dielectric (ILD) layer 20 formed passivating the metal oxide semiconductor field effect transistor (MOSFET) device within the semiconductor integrated circuit microelectronic fabrication whose schematic cross-sectional diagram is illustrated in FIG. 1.

Significant to the present invention is that the interlevel dielectric (ILD) layer 20 is formed of a lesser conventional dielectric material selected from the group including by not limited to fluorosilicate glass (FSG) dielectric materials, atmospheric pressure thermal chemical vapor deposited (APCVD) dielectric materials (typically and preferably formed of silicon oxide deposited employing tetra ethyl ortho silicate (TEOS) as a silicon source material and ozone as an oxidant source material at a reactor chamber pressure of from about 700 to about 800 torr), sub-atmospheric pressure thermal chemical vapor deposited (SACVD) dielectric materials (typically and preferably formed of silicon oxide deposited employing tetra ethyl ortho silicate (TEOS) as a silicon source material and ozone as an oxidant source material at a reactor chamber pressure of from about 200 to about 700 torr) and spin-on-glass (SOG) dielectric materials (such as but not limited to silicate spin-on-glass (SOG) dielectric materials and silsesquioxane spin-on-glass (SOG) dielectric materials (such as but not limited to hydrogen, carbon bonded hydrocarbon and carbon bonded fluorocarbon silsesquioxane spin-on-glass (SOG) dielectric materials)). Such lesser conventional dielectric materials, in comparison with more conventionally formed dielectric materials, such as but not limited to silicon oxide dielectric materials, silicon nitride dielectric materials and silicon oxynitride dielectric materials deposited employing conventional methods, such as but not limited to low pressure chemical vapor deposition (CVD) methods and plasma enhanced chemical vapor deposition (PECVD) methods (each of which employ a reactor chamber pressure of from about 0.1 to about 10 torr, often have lower dielectric constants and often provide when passivating microelectronic devices such as the metal oxide semiconductor field effect transistor (MOSFET) device whose schematic cross-sectional diagram is illustrated in FIG. 1, greater shifts in operating parameters of those microelectronic devices.

More preferably, within the preferred embodiment of the present invention, the interlevel dielectric (ILD) layer 20 is formed of a fluorosilicate glass (FSG) dielectric material deposited employing a high density plasma chemical vapor deposition (HDP-CVD) method. As is understood by a person skilled in the art, high density plasma chemical vapor deposition (HDP-CVD) methods are simultaneous plasma enhanced chemical vapor deposition (PECVD) methods undertaken in conjunction with bias sputter deposition methods, where a deposition rate within a plasma enhanced chemical vapor deposition (PECVD) method employed within a high density plasma chemical vapor deposition (HDP-CVD) exceeds a sputtering rate within the coincident bias sputtering method employed within the high density plasma chemical vapor deposition (HDP-CVD) method.

Within the preferred embodiment of the present invention, the high density plasma chemical vapor deposition (HDP-CVD) method which is employed for forming the interlevel dielectric (ILD) layer 20 when formed of a fluorosilicate glass (FSG) dielectric material typically and preferably employs a silane ($SiH_4$) silicon source material, a nitrous oxide ($N_2O$) oxidant source material, an argon (Ar) sputtering source material and a silicon tetrafluoride ($SiF_4$) fluorine source material.

Typically and preferably, the high density plasma chemical vapor deposition (HDP-CVD) method also employs: (1) a reactor chamber pressure of from about 0.5 to about 10 mtorr; (2) a source radio frequency power of from about 1,000 to about 5,000 watts at a source radio frequency of 13.56 MHZ, and a bias sputtering power of from about 2,000 to about 3,000 watts; (3) a semiconductor substrate 10 temperature of from about 350 to about 450 degrees centigrade; (4) a silane flow rate of from about 40 to about 60 standard cubic centimeters per minute (sccm); (5) a nitrous oxide flow rate of from about 300 to about 400 standard cubic centimeters per minute (sccm); (6) an argon flow rate of from about 10 to about 150 standard cubic centimeters per minute (sccm); and (7) a silicon tetrafluoride ($SiF_4$) flow rate of from about 20 to about 40 standard cubic centimeters per minute (sccm).

Consistent with that which is illustrated within the schematic cross-sectional diagram of FIG. 1, the interlevel dielectric (ILD) layer 20 is typically and preferably formed as a planarized layer, formed while employing planarizing methods as are conventional in the art of semiconductor integrated microelectronic fabrication, including but not limited to chemical mechanical polish (CMP) planarizing methods and reactive ion etch (RIE) etchback planarizing methods, although the former planarizing methods are preferred, to provide the interlevel dielectric (ILD) layer 20 of thickness from about 5,500 to about 9,500 angstroms.

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the semiconductor integrated circuit microelectronic fabrication is thermally annealed within a hydrogen annealing environment 22 to thus form from the series of structures within the semiconductor integrated circuit microelectronic fabrication whose schematic cross-sectional diagram is illustrated in FIG. 1 a corresponding series of hydrogen annealed structures comprising: (1) a hydrogen annealed semiconductor substrate 10' having formed therein; (2) a pair of hydrogen annealed isolation regions 12a' and 12b' which define an active region of the hydrogen annealed semiconductor substrate 10', the active region of the hydrogen annealed semiconductor substrate 10' having formed thereupon; (3) a hydrogen annealed gate dielectric layer 14' in turn having formed aligned thereupon; (4) a hydrogen annealed gate electrode 16', in conjunction with; (5) a pair of hydrogen annealed source/drain regions 18a' and 18b' formed within the active region of the hydrogen annealed semiconductor substrate 10' at locations other than those occupied by the hydrogen annealed gate dielectric layer 14' and the hydrogen annealed gate electrode 16', where all of the foregoing structures are passivated with; (6) a hydrogen annealed interlevel dielectric (ILD) layer 20'. Within the preferred embodiment of the present invention, the hydrogen annealing environment 22 is typically and preferably provided employing a pure hydrogen environment provided at: (1) a temperature of from about 350 to about 450 degrees centigrade, more preferably from about 400 to about 420 degrees centigrade; (2) a pressure of from about 700 to about 800 torr, more preferably from about 740 to about 780 torr; (3) a hydrogen flow rate of from about 4,000 to about 5,000 standard cubic centimeters per minute (sccm); and (4) an exposure time of from about 80 to about 100 minutes.

Within the preferred embodiment of the present invention, it is believed that by annealing the metal oxide semiconductor field effect transistor (MOSFET) device whose schematic cross-sectional diagram is illustrated in FIG. 1 within the hydrogen annealing environment 22 to provide the metal oxide semiconductor field effect transistor (MOSFET) device whose schematic cross-sectional diagram is illustrated in FIG. 2, the hydrogen within the hydrogen annealing environment 22 acts to stabilize operating parameters, interface states and trapped charges within the metal oxide semiconductor field effect transistor (MOSFET) device whose schematic crosssectional diagram is illustrated within FIG. 1 while simultaneously also stabilizing the interlevel dielectric (ILD) layer 20 which is otherwise susceptible to instability in comparison with an interlevel dielectric (ILD) layer formed of a conventional dielectric material employed when fabricating dielectric layers within microelectronic fabrications.

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein: (1) there is formed upon the hydrogen annealed interlevel dielectric (ILD) layer 20' a pair of patterned first conductor layers 24a and 24b; and (2) there is in turn formed upon the pair of patterned first conductor layers 24a and 24b and exposed portions of the hydrogen annealed interlevel dielectric (ILD) layer 20' an intermetal dielectric (IMD) layer 26.

Within the preferred embodiment of the present invention, the pair of patterned first conductor layers 24a and 24b and the inter-metal dielectric (IMD) layer 26 may be formed employing methods and materials as are conventional in the art of microelectronic fabrication. Typically and preferably, the pair of patterned first conductor layers 24a and 24b is formed of a conductor material selected from the group consisting of metal and metal alloy conductor materials, more preferably, aluminum, aluminum alloy, copper, copper alloy, tungsten or tungsten alloy conductor materials. Similarly, the inter-metal dielectric (IMD) layer 26 is typically and preferably formed of a dielectric material analogous or equivalent to the dielectric material from which is formed the interlevel dielectric (ILD) 20 layer and the hydrogen annealed interlevel dielectric (ILD) layer 20'. Typically and preferably, the pair of patterned first conductor layers 24a and 24b are each formed to a thickness of from about 4000 to about 6000 angstroms, while the intermetal dielectric (IMD) layer 26 is typically and preferably formed to a planarized thickness of from about 9000 to about 13000 angstroms.

Although the preferred embodiment of the present invention illustrates the present invention within the context of annealing within the hydrogen annealing environment 22 the semiconductor integrated circuit microelectronic fabrication whose schematic cross-sectional diagram is illustrated in FIG. 1 to provide the semiconductor integrated circuit microelectronic fabrication whose schematic cross-sectional diagram is illustrated in FIG. 2, and there is then formed upon the semiconductor integrated circuit microelectronic fabrication whose schematic crosssectional diagram is illustrated in FIG. 2 the pair of patterned first conductor layers 24a and 24b and the intermetal dielectric (IMD) layer 26 to provide the semiconductor integrated circuit microelectronic fabrication whose schematic cross-sectional diagram is illustrated in FIG. 3, there may also be annealed within a hydrogen annealing environment analogous or equivalent to the hydrogen annealing environment 22 as illustrated within the schematic cross-sectional diagram of FIG. 2 a microelectronic fabrication otherwise equivalent to the microelectronic fabrication whose schematic cross-sectional diagram is illustrated in FIG. 1, but with additional microelectronic fabrication structures (such as but not limited to the pair of patterned first conductor layers 24a and 24b and the inter-metal dielectric (IMD) layer 26) formed thereupon. However, it is preferred within the present invention and the preferred embodiment of the present invention to employ the hydrogen annealing environment 22 to form the semiconductor integrated circuit microelectronic fabrication whose schematic cross-sectional diagram is illustrated in FIG. 2 from the semiconductor integrated circuit microelectronic fabrication is illustrated in FIG. 1 either: (1) immediately subsequent to forming the inter level dielectric (ILD) layer 20; or (2) immediately subsequent to forming the pair of patterned first conductor layers 24a and 24b.

Upon forming the semiconductor integrated circuit microelectronic fabrication whose schematic cross-sectional diagram is illustrated in FIG. 3, there is formed a semiconductor integrated circuit microelectronic fabrication having formed therein a metal oxide semiconductor field effect transistor (MOSFET) device with enhanced stability. The metal oxide semiconductor field effect transistor (MOSFET) device has enhanced stability incident to being passivated with a dielectric layer formed from a dielectric material selected from the group including but not limited to: (1) fluorosilicate glass (FSG) dielectric materials; (2) atmospheric pressure chemical vapor deposited (APCVD) dielectric materials; (3) sub-atmospheric pressure chemical vapor deposited (SACVD) dielectric materials; (4) spin-on-glass (SOG) dielectric materials, and then stabilized in a hydrogen annealing environment.

EXAMPLES

There was obtained a series of N-doped (100) silicon semiconductor substrates and a series of P-doped (100) silicon semiconductor substrates. Formed within the series of N-doped semiconductor substrates was a series of was a series of P metal oxide semiconductor field effect transistor (P-MOSFET) devices and formed within the series of P-silicon semiconductor substrates was a series of N metal oxide semiconductor field effect transistor (N-MOSFET) devices.

For either of the series of semiconductor substrates employed for forming either the series of P or N metal oxide semiconductor field effect transistor (MOSFET) devices there was employed a gate dielectric layer formed of silicon oxide of thickness about 32 angstroms; (2) a gate electrode formed of doped polysilicon of thickness about 2000 angstroms; and (3) a pair of source/drain regions formed employing an ion implant method employing an appropriate dopant at an ion implantation dose of about 3E15 ions per square centimeter dose and an ion implantation energy of about 10keV.

Upon two thirds of the semiconductor substrates, and divided equally between the two dopant polarities of the silicon semiconductor substrates, was then formed a fluorosilicate glass (FSG) dielectric layer formed employing a high density plasma chemical vapor deposition (HDP-CVD) method employing silane as a silicon source material, nitrous oxide as an oxidant source material, argon as a sputtering source material and silicon tetrafluoride ($SiF_4$) as a fluorine source material. The high density plasma chemical vapor deposition (HDPCVD) method also employed: (1) a reactor chamber pressure of about 5 mtorr; (2) a source radio frequency power of about 3300 watts at a source radio frequency of 13.56 MHZ and a bias power of about 2500 watts; (3) a semiconductor substrate temperature of about 400 degrees centigrade; (4) a silane flow rate of about 50 standard cubic centimeters per minute (sccm); (5) a nitrous oxide flow rate of about 350 standard cubic centimeters per minute (sccm); (6) an argon flow rate of about 40 standard cubic centimeters per minute (sccm) and (7) a silicon tetrafluoride flow rate of about 25 standard cubic centimeters per minute (sccm).

The fluorosilicate glass (FSG) dielectric layers were formed and subsequently planarized to a thickness of about 11000 angstroms each while employing a chemical mechanical polish (CMP) planarizing method.

Over the remaining third of the semiconductor substrates and covering the corresponding series of metal oxide semiconductor field effect transistor (MOSFET) devices was formed a series of undoped silicate glass (USG) dielectric layers formed employing a high density plasma chemical vapor deposition (HDP-CVD) method and materials equivalent to the high density plasma chemical vapor deposition (HDP-CVD) method and materials employed for forming the fluorosilicate (FSG) dielectric layers upon the first two thirds of the semiconductor substrates, but wherein there was not employed a fluorine source material of any variety, and in particular there was not employed a carbon tetrafluoride fluorine source material. The series of undoped silicate glass (USG) dielectric layers were similarly formed to a planarized thickness of about 2000 angstroms.

One half of the two thirds of the semiconductor substrates having formed thereover the fluorosilicate glass (FSG) dielectric layers was then thermally annealed within a hydrogen annealing environment accord with the preferred embodiment of the present invention. The hydrogen annealing environment employed: (1) a reactor chamber pressure of about 760 torr; (2) a temperature of about 410 degrees centigrade; (3) a hydrogen concentration consisting essentially of hydrogen; and (4) a hydrogen flow rate of about 4500 standard cubic centimeters per minute (sccm), for a thermal annealing time period of about 90 minutes.

Thus, there was formed from the initial two series of silicon semiconductor substrates three separate groups of silicon semiconductor substrates having formed therein an otherwise equivalent series of metal oxide semiconductor field effect transistor (MOSFET) devices of N and P polarity in equal numbers, each group being passivated with either: (1) a series of undoped silicate glass (USG) dielectric layers without hydrogen annealing; (2) a series of fluorosilicate glass (FSG) dielectric layers without hydrogen annealing; or (3) a series fluorosilicate glass (FSG) dielectric layers with hydrogen annealing.

There was then fabricated various subgroups from each of the three groups of semiconductor substrates. The various subgroups had formed thereupon increasing numbers of patterned conductor layers with corresponding increasing numbers of inter metal dielectric (IMD) layers formed of either a fluorosilicate glass (FSG) dielectric material or an undoped silicate glass (USG) dielectric material, consistent with the identity of the first dielectric material which directly passivated the series of metal oxide semiconductor field effect transistor (MOSFET) devices. Similarly, no hydrogen annealing was employed within any of the additional fabrication of the subgroups of semiconductor substrates.

There was then measured for the series of metal oxide semiconductor field effect transistors (MOSFET) devices formed within the series of semiconductor substrates various electrical parameters as are conventional in the art of semiconductor integrated circuit microelectronic fabrication. The parameters included drain current, threshold voltage, swing voltage and capacitance-voltage characteristics.

Figure 4:
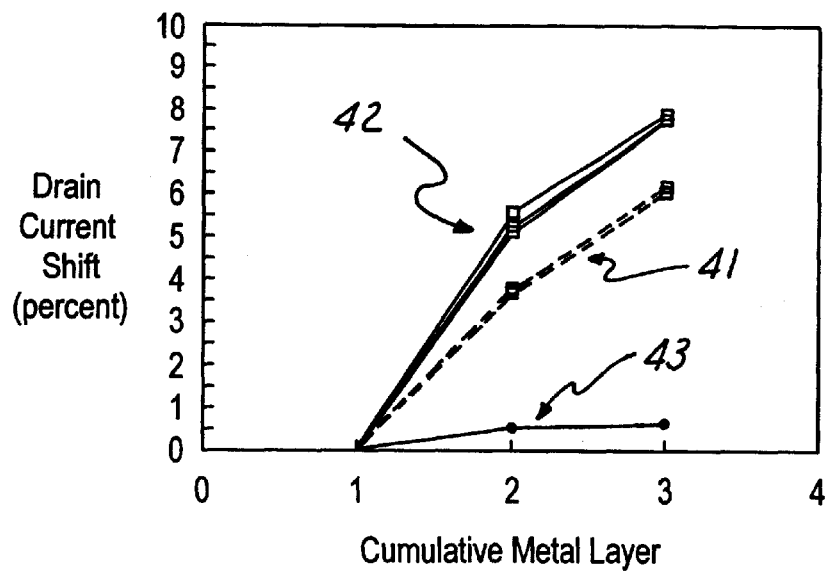
FIG. 4 and FIG. 5 show a pair of graphs of Drain Current Shift versus Cumulative Metal Layer for a series of metal oxide semiconductor field effect transistors (MOSFET) devices fabricated in accord with the examples of the present invention.
Figure 5:
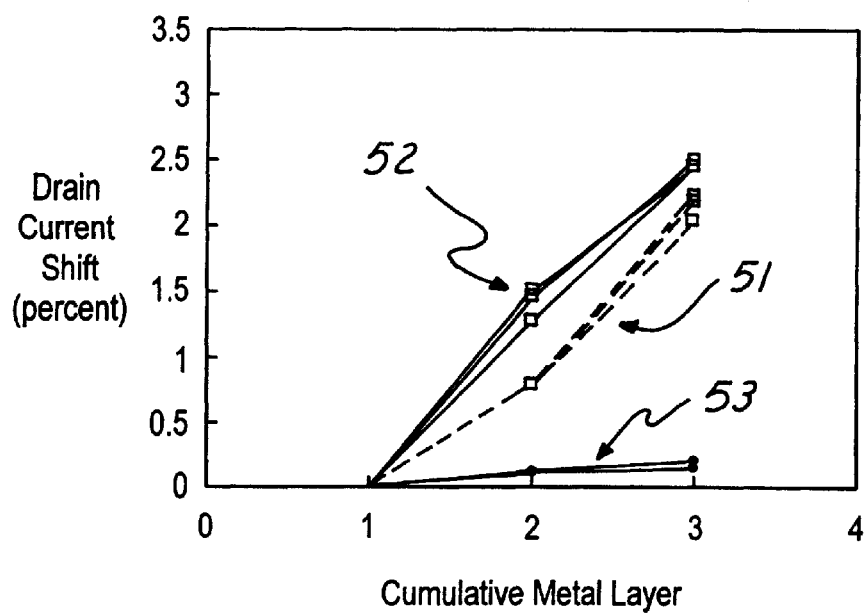

Shown in FIG. 4 and FIG. 5 is a pair of graphs of Drain Current Shift versus Cumulative Metal Layer for metal oxide semiconductor field effect transistors (MOSFET) devices fabricated in accord with the foregoing sub-groups, where the data as illustrated in FIG. 4 is derived from measurements of N metal oxide semiconductor field effect transistor (N-MOSFET) devices and the data as illustrated in FIG. 5 is derived from measurements of P metal oxide semiconductor field effect transistor (P-MOSFET) devices. Within FIG. 4, the lines corresponding with reference number 41 correspond with measured drain current shifts for N metal oxide semiconductor field effect transistor (N-MOSFET) devices passivated with undoped silicate glass (USG) layers absent any hydrogen annealing. Similarly, within FIG. 4, the lines corresponding with reference numeral 42 correspond with measured drain current shifts for N metal oxide semiconductor field effect transistors (N-MOSFET) devices passivated with fluorosilicate glass (FSG) layers absent any hydrogen annealing. Finally, within FIG. 4, the lines corresponding with reference numeral 43 correspond with measured drain current shifts for N metal oxide semiconductor field effect transistor (N-MOSFET) devices passivated with fluorosilicate glass (FSG) layers with hydrogen annealing. In FIG. 4, curve 43 and 42 show the difference of pure $H_2$ alloy recipe, i.e. curve 43 with pure $H_2$ alloy at M1 curve 42 without pure $H_2$ alloy. They both have the same 6FSG layers, i.e. not only 1 layer.

Within FIG. 5, the lines corresponding with reference numerals 51, 52 and 53 correspond with measured drain current shifts for P metal oxide semiconductor field effect transistor (P-MOSFET) devices passivated with layers in accord with the lines corresponding with reference numerals 41, 42 and 43 within FIG. 4. The key point is if pure $H_2$ alloy at M1 device will not shift from M1 to M6 as shown by curves 43 and 53.

As is thus clearly illustrated with FIG. 4 and FIG. 5 the use of a hydrogen annealing in accord with the preferred embodiment of the present invention provides a stabilized drain current within either an N or a P metal oxide semiconductor field effect transistor (MOSFET) device independent of further processing of the metal oxide semiconductor field effect transistor (MOSFET) device.

Although FIG. 4 and FIG. 5 illustrate the value of the present invention in attenuating a drain current shift when fabricating a metal oxide semiconductor field effect transistor (MOSFET) device, it has also been observed experimentally that the method of the present invention attenuates, in addition to drain current shifts, threshold voltage shifts, swing voltage shifts and line width specific parameter shifts within metal oxide semiconductor field effect transistors (MOSFET) devices fabricated in accord with the present invention.

Figure 6:
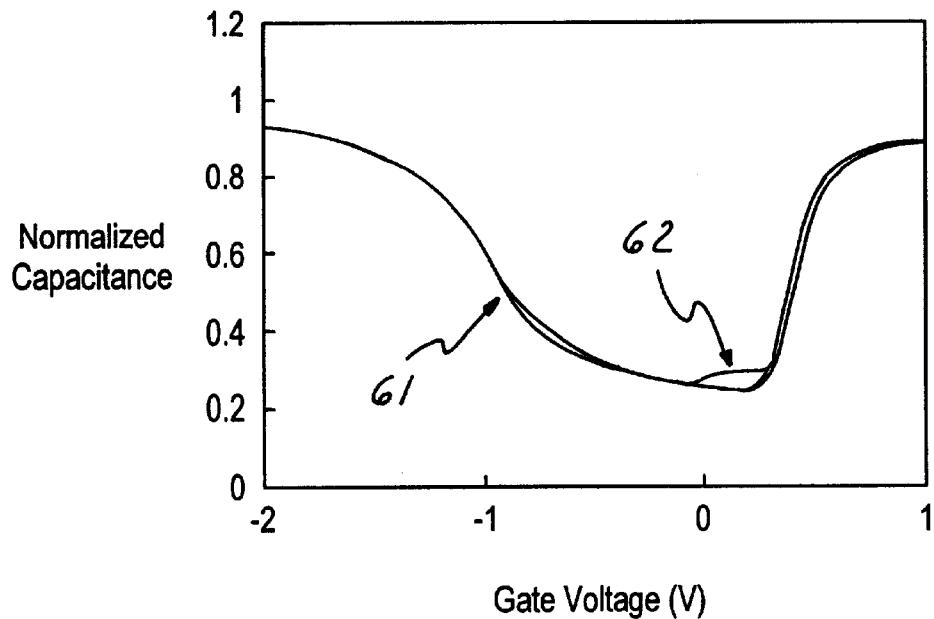
FIG. 6 and FIG. 7 show a pair of graphs of Normalized Capacitance versus Gate Voltage for a series of metal oxide semiconductor field effect transistors (MOSFET) devices fabricated in accord with the examples of the present invention.
Figure 7:
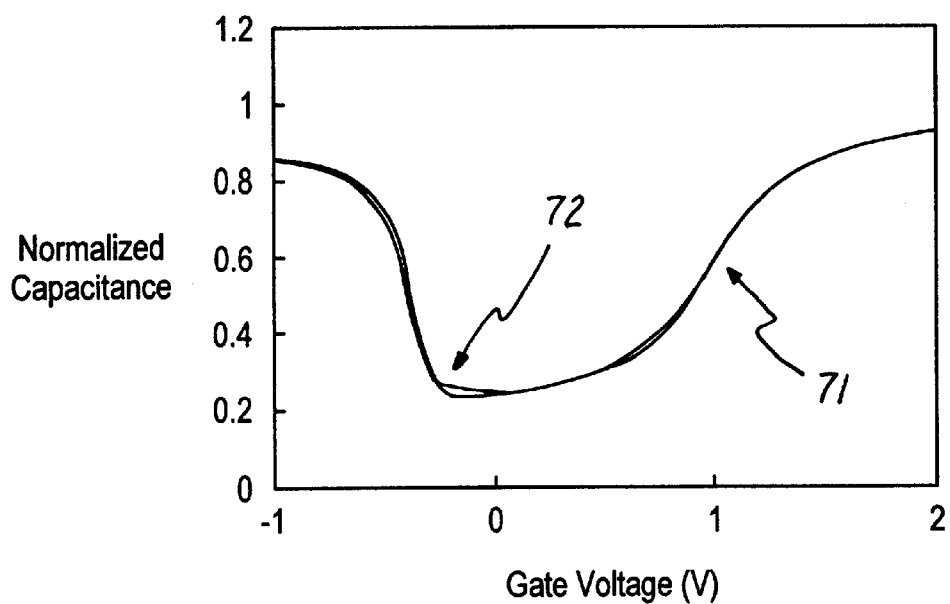

Referring now to FIG. 6 and FIG. 7, there is shown a pair of graphs of Normalized Capacitance versus Gate Voltage, also for metal oxide semiconductor field effect transistor (MOSFET) devices fabricated in accord with the foregoing sub-groups. FIG. 6 illustrates such capacitance versus voltage characteristics for various N metal oxide semiconductor field effect transistor (MOSFET) devices fabricated in accord with the examples and FIG. 7 illustrates such capacitance versus voltage characteristics for various P metal oxide semiconductor field effect transistor (MOSFET) devices fabricated in accord with the examples. Although limited distinctions are perceptible therein, the lines corresponding with reference numeral 61 in FIG. 6 and the lines corresponding with reference numeral 71 in FIG. 7 are derived from an overlap of measurements for: (1) a metal oxide semiconductor field effect transistor (MOSFET) device passivated with a single fluorosilicate glass (FSG) layer without any hydrogen annealing; (2) a metal oxide semiconductor field effect transistor (MOSFET) device passivated with six fluorosilicate glass (FSG) layers, also without any hydrogen annealing; and (3) a metal oxide semiconductor field effect transistor (MOSFET) device passivated with a single fluorosilicate glass (FSG) layer, with hydrogen annealing in accord with the preferred embodiment of the present invention. The minor discontinuities in overlay which correspond with reference numeral 62 in FIG. 6 and reference numeral 72 in FIG. 7 derive from metal oxide semiconductor field effect transistor (MOSFET) devices passivated with condition (2) and (3). The key point is that gate oxide interface state can be passivated by pure $H_2$ alloy at M1 or add 6 layers FSG (condition 2, 3). This is why device shift from M1 to M6. It is due to gate oxide interface state improved.

As is seen from review of the data in FIG. 6 and FIG. 7 in comparison with the data contained within FIG. 4 and FIG. 5, while the method of the present invention provides particular value in limiting drain current shifts (as well as shifts in other parameters) within metal oxide semiconductor field effect transistor (MOSFET) devices incident to additional fabrication of those metal oxide semiconductor field effect transistor (MOSFET) devices, capacitance characteristics of those metal oxide semiconductor field effect transistor (MOSFET) devices remain substantially unchanged.

As is understood by a person skilled in the art, the preferred embodiment and examples of the present invention are illustrative of the present invention rather than limiting of the present invention. Revisions and modifications may be made to methods, materials, structures and dimensions through which is provided a microelectronic fabrication in accord with the preferred embodiment and examples of the present invention, while still providing a microelectronic fabrication in accord with the present invention, further in accord with the accompanying claims.

What is claimed is:

1. A method for fabricating a microelectronic fabrication comprising:

providing a substrate;

forming over the substrate a microelectronic device;

forming over the microelectronic device a passivating dielectric layer formed from a passivating dielectric material selected from the group consisting of fluorosilicate glass (FSG) passivating dielectric materials, atmospheric pressure chemical vapor deposited (APCVD) passivating dielectric materials, subatmospheric pressure chemical vapor deposited (SACVD) passivating dielectric materials and spin-on-glass (SOG) passivating dielectric materials to form from the microelectronic device a passivated microelectronic device; and annealing thermally, while employing a thermal annealing method employing an atmosphere comprising hydrogen at a pressure from about 700 to about 800 torr, the passivated microelectronic device to form a stabilized passivated microelectronic device.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the microelectronic device is selected from the group consisting of transistors, resistors, diodes and capacitors.

4. The method of claim 1 wherein the passivating dielectric layer is formed to a thickness of from about 8000 to about 14000 angstroms.

5. The method of claim 1 wherein the thermal annealing method employs a temperature of from about 350 to about 450 degrees centigrade.

6. The method of claim 1 wherein the atmosphere is 100% pure hydrogen.

7. A method for fabricating an integrated circuit microelectronic fabrication comprising:

providing a semiconductor substrate;

forming over the semiconductor substrate a microelectronic device;

forming over the microelectronic device a passivating dielectric layer formed from a passivating dielectric material selected from the group consisting of fluorosilicate glass (FSG) passivating dielectric materials, atmospheric pressure chemical vapor deposited (APCVD) passivating dielectric materials, subatmospheric pressure chemical vapor deposited (SACVD) passivating dielectric materials and spin-on-glass (SOG) passivating dielectric materials to form from the microelectronic device a passivated microelectronic device; and annealing thermally, while employing a thermal annealing method employing an atmosphere comprising hydrogen at a pressure from about 700 to about 800 torr, the passivated microelectronic device to form a stabilized passivated microelectronic device.

8. The method of claim 7 wherein the microelectronic device is a metal oxide semiconductor (MOS) device.

9. The method of claim 8 wherein the metal oxide semiconductor (MOS) device is selected from the group consisting of metal oxide semiconductor (MOS) capacitor devices and metal oxide semiconductor field effect transistor (MOSFET) devices.

10. The method of claim 7 wherein the passivating dielectric layer is formed to a thickness of from about 8000 to about 14000 angstroms.

11. The method of claim 7 wherein the thermal annealing method employs a temperature of from about 350 to about 450 degrees centigrade.

12. The method of claim 7 wherein the atmosphere comprising hydrogen consists essentially of hydrogen.

13. The method of claim 9 wherein incident to forming from the metal oxide semiconductor field effect transistor (MOSFET) device a stabilized passivated metal oxide semiconductor field effect transistor (MOSFET) there is stabilized a drain current shift of the metal oxide semiconductor field effect transistor (MOSFET) device without affecting a capacitance of the metal oxide semiconductor field effect transistor (MOSFET) device.

14. A method for fabricating a microelectronic fabrication comprising:

providing a substrate;

forming over the substrate a microelectronic device;

forming over the microelectronic device a passivating dielectric layer formed from a passivating dielectric material selected from the group consisting of fluorosilicate glass (FSG) passivating dielectric materials, atmospheric pressure chemical vapor deposited (APCVD) passivating dielectric materials, subatmospheric pressure chemical vapor deposited (SACVD) passivating dielectric materials and spin-on-glass (SOG) passivating dielectric materials to form from the microelectronic device a passivated microelectronic device; and annealing thermally, while employing a thermal annealing method employing an atmosphere comprising 100% hydrogen, the passivated microelectronic device to form a stabilized passivated microelectronic device.

15. The method of claim 14 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

16. The method of claim 14 wherein the microelectronic device is selected from the group consisting of transistors, resistors, diodes and capacitors.

17. The method of claim 14 wherein the passivating dielectric layer is formed to a thickness of from about 8000 to about 14000 angstroms.

18. The method of claim 14 wherein the thermal annealing method employs a temperature of from about 350 to about 450 degrees centigrade.

19. The method of claim 14 wherein the thermal annealing method employs a pressure of from about 700 to about 800 torr.

* * * * *